(12) United States Patent
Dono

(10) Patent No.: US 6,867,465 B2
(45) Date of Patent: Mar. 15, 2005

(54) METHOD OF DESIGNING SEMICONDUCTOR INTEGRATED CIRCUIT DEVICE AND SEMICONDUCTOR INTEGRATED CIRCUIT DEVICE MANUFACTURED USING THE SAME

(75) Inventor: Chiaki Dono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 192 days.

(21) Appl. No.: 10/345,756

(22) Filed: Jan. 16, 2003

(65) Prior Publication Data

US 2003/0140323 A1 Jul. 24, 2003

(30) Foreign Application Priority Data

Jan. 21, 2002 (JP) ........................................ 2002-011236

(51) Int. Cl.$^7$ ............................................. H01L 29/76
(52) U.S. Cl. ..................... 257/401; 257/206; 257/207; 257/208; 257/210; 257/211
(58) Field of Search ............................... 257/206–208, 257/210, 211, 401

(56) References Cited

U.S. PATENT DOCUMENTS 6,462,364 B1 * 10/2002 Horiuchi ..................... 257/288

FOREIGN PATENT DOCUMENTS

JP 11-163642 6/1999

* cited by examiner

Primary Examiner—David Nelms
Assistant Examiner—Andy Huynh
(74) Attorney, Agent, or Firm—Scully, Scott, Murphy & Presser

(57) ABSTRACT

In a semiconductor integrated circuit device with a transistor, there are a single diffusion layer and a gate base electrode provided outside of the diffusion layer to extend in a pitch direction. N (N is an odd positive integer) gate electrodes are provided above the diffusion layer in parallel in the pitch direction to extend from the gate base electrode in a height direction orthogonal to the pitch direction to pass through the diffusion layer. Source nodes are provided on the diffusion layer along one of the N gate electrodes on a side outside the N gate electrodes in a direction opposing to the pitch direction as a head gate electrode. Drain nodes are provided on the diffusion layer along another of the N gate electrodes on a side outside the N gate electrodes in the pitch direction as a last gate electrode. The drain nodes are less than the source nodes.

22 Claims, 13 Drawing Sheets

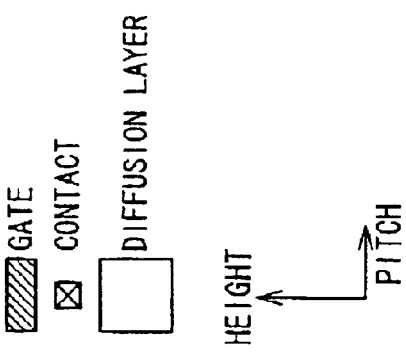
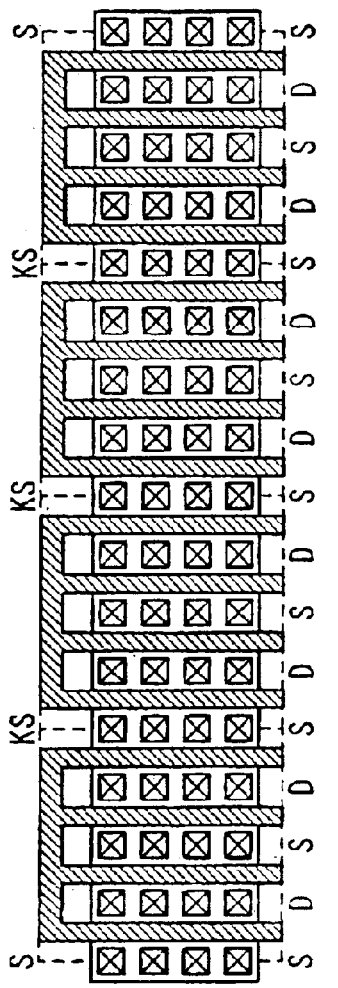
Fig. 1A-2 PRIOR ART
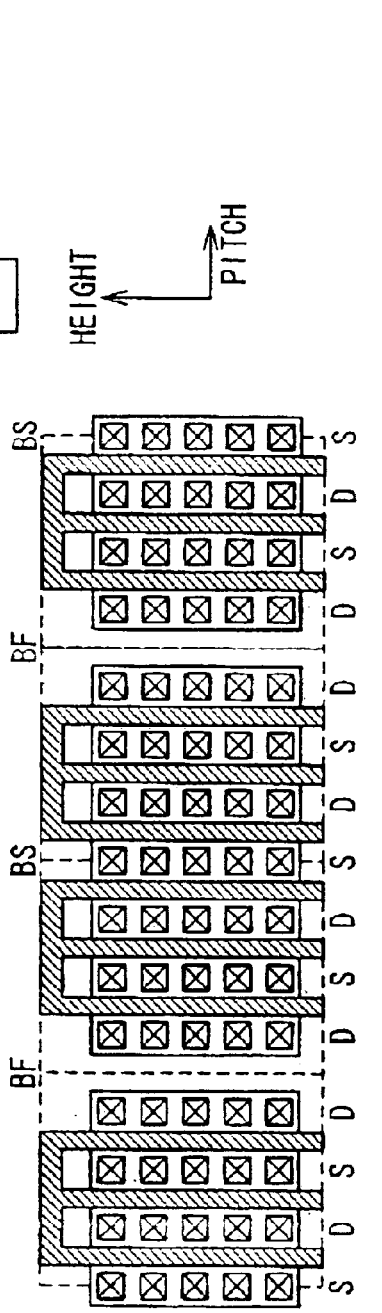
Fig. 1B-2 PRIOR ART
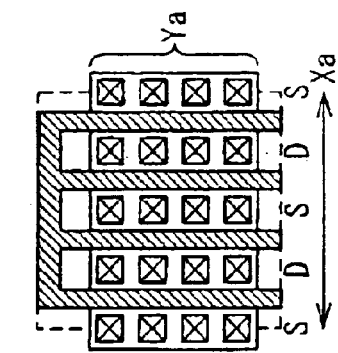
Fig. 1A-1 PRIOR ART
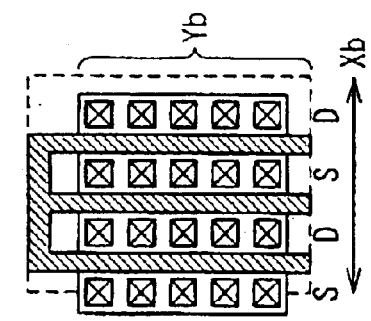
Fig. 1B-1 PRIOR ART Fig. 1C-1
PRIOR ART
Fig. 1C-2
PRIOR ART
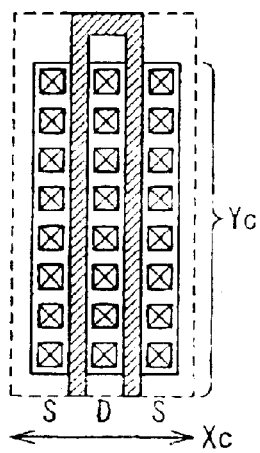
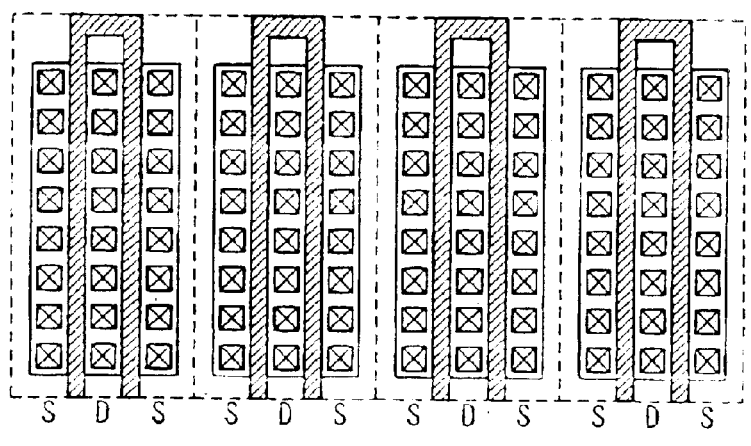
Fig. 1D-1
PRIOR ART
Fig. 1D-2
PRIOR ART
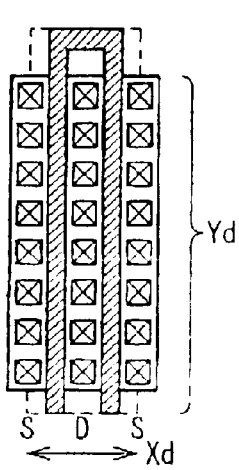
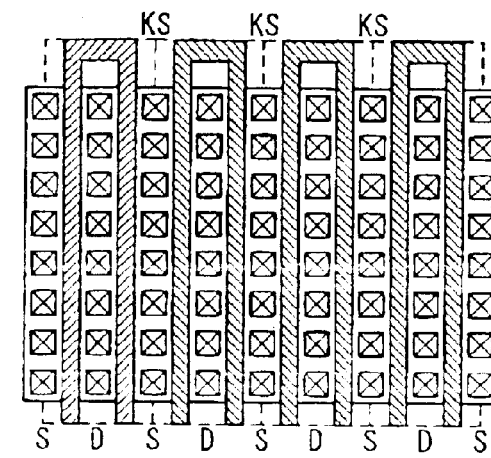
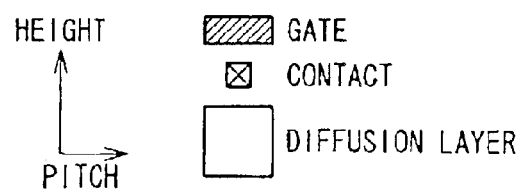

Fig. 1E-1 PRIOR ART    Fig. 1E-2 PRIOR ART
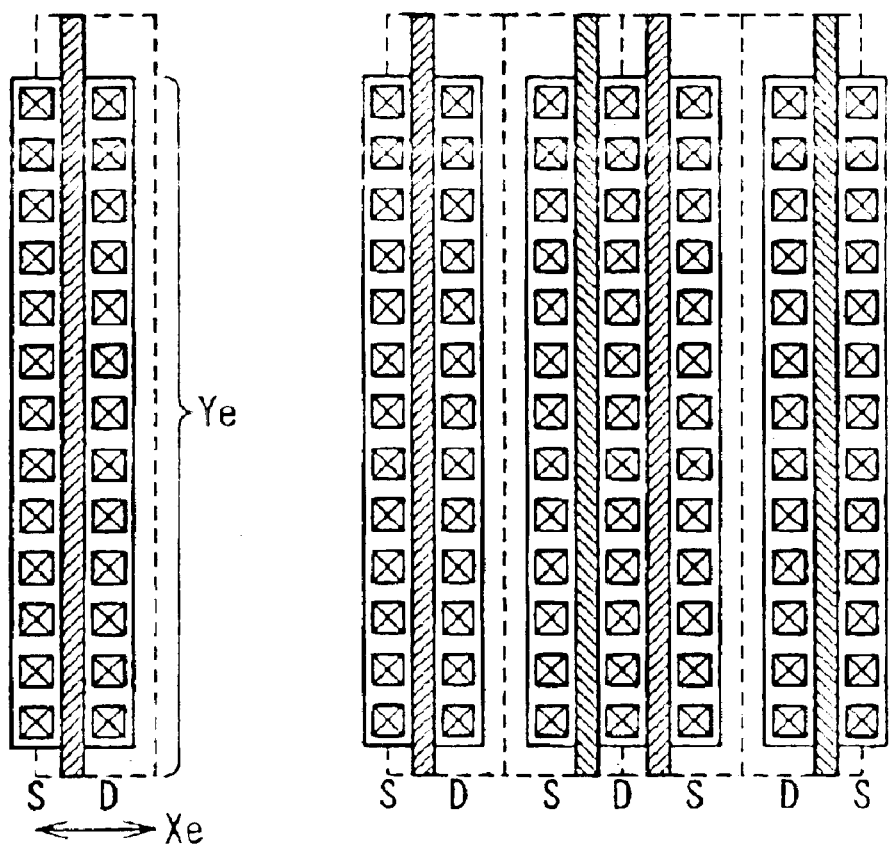
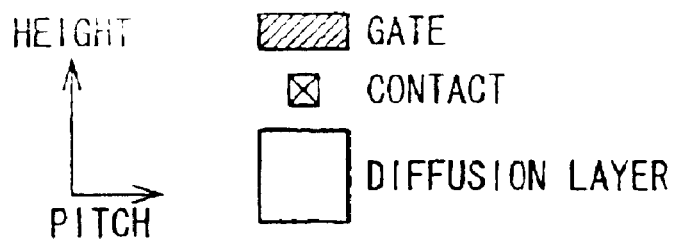

| W: DIFFUSION LAYER WIDTH | 10.00 (μm) |
|---|---|
| a: DISTANCE BETWEEN GATE AND DIFFUSION LAYER | 0.10 (μm) |
| b: GATE WIDTH | 0.20 (μm) |
| c: CONTACT DIAMETER | 0.20 (μm) |
| d: DISTANCE BETWEEN CONTACT AND DIFFUSION LAYER | 0.10 (μm) |
| e: DISTANCE BETWEEN CONTACT AND GATE | 0.10 (μm) |
| f: DISTANCE BETWEEN DIFFUSION LAYERS | 0.40 (μm) |

Fig. 6

| | PITCH (X) | GATES (N) | HEIGHT (Y) | SHAPE OF DIFFUSION LAYER |
|---|---|---|---|---|
| ① | $N \cdot (b+c+2e)+c/2+d+f/2$ | 1 | W/N | FIGS. 1E-1 AND 1E-2 |
| ② | $N \cdot (b+c+2e)$ | 2 | W/N | FIGS. 1D-1 AND 1D-2 |
| ③ | $[2(N+1) \cdot b+2(N+1)c+2\{2(2N+1)-1\}e \cdot 3a+3d]/2$ | 2 | W/N | FIGS. 1C-1 AND 1C-2 |
| ④ | $N \cdot (b+c+2e)+c/2+d+f/2$ | 3 | W/N | FIGS. 1B-1 AND 1B-2 |
| ⑤ | $N \cdot (b+c+2e)$ | 4 | W/N | FIGS. 1A-1 AND 1A-2 |
| ... | ... | ... | ... | ... |

| | | | | |
|---|---|---|---|---|
| ③' | $[2(N+1) \cdot b+2(N+1)c+2\{2(2N+1)-1\}e \cdot 3a+3d]/2$ | 2.5 | $(2W+f)/(2N+1)$ | FIGS. 3A AND 3B |

Fig. 7

| | PITCH(X) | GATES(N) | HEIGHT(Y) | AREA(X/Y) | SHAPE OF DIFFUSION LAYER |
|---|---|---|---|---|---|
| ① | 1.00 | 1.00 | 10.00 | 10.00 | FIGS. 1E-1 AND 1E-2 |
| ② | 1.20 | 2.00 | 5.00 | 6.00 | FIGS. 1D-1 AND 1D-2 |
| ③ | 2.00 | 2.00 | 5.00 | 10.00 | FIGS. 1C-1 AND 1C-2 |
| ④ | 2.20 | 3.00 | 3.33 | 7.33 | FIGS. 1B-1 AND 1B-2 |
| ⑤ | 2.40 | 4.00 | 2.55 | 6.00 | FIGS. 1A-1 AND 1A-2 |
| ... | ... | ... | ... | ... | ... |

| | | | | | |
|---|---|---|---|---|---|
| ③' | 2.00 | 2.5 | 4.08 | 8.16 | FIGS. 3A AND 3B |

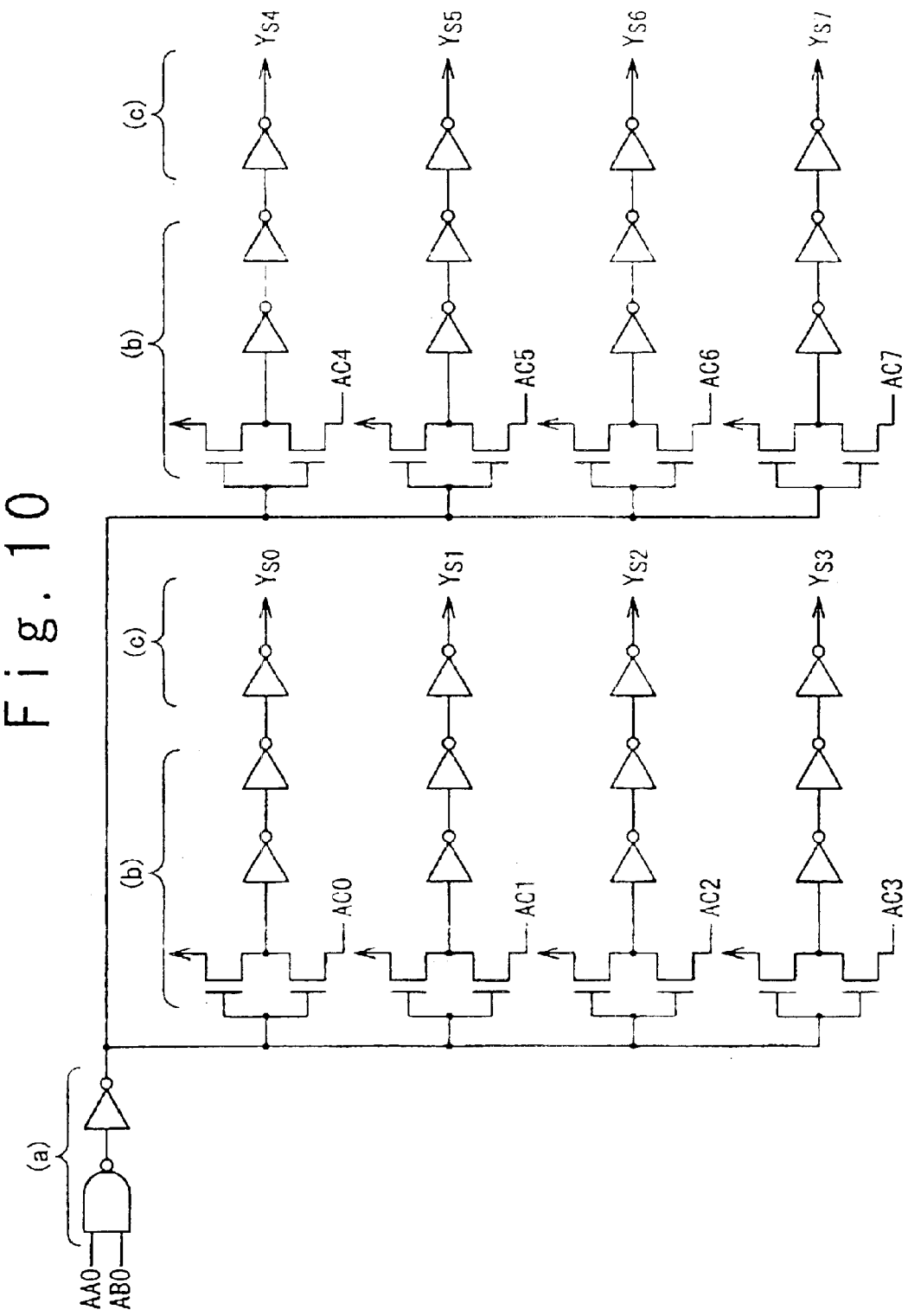

METHOD OF DESIGNING SEMICONDUCTOR INTEGRATED CIRCUIT DEVICE AND SEMICONDUCTOR INTEGRATED CIRCUIT DEVICE MANUFACTURED USING THE SAME

BACKGROUND OF THE INVENTION

1. Field of the Invention

The present invention relates to a method of designing a semiconductor integrated circuit device and a semiconductor integrated circuit device manufactured by using the same.

2. Description of the Related Art

In a semiconductor integrated circuit device, a circuit pattern is often repeatedly arranged. With a layout of the circuit patterns, constraints of the layout of the circuit patterns have been more severe, as the semiconductor fine fabrication technique proceeds. For example, in case of a DRAM, circuit patterns need to be arranged in plural times of a layout pitch of unit layout cell, depending on the size of a memory cell array. Circuits with such circuit patterns are such as a sense amplifier, a sub-word driver, a main word driver, and a Y decoder for the memory cell array. In this case, the area of the unit layout cell is determined in accordance with a circuit scale such as the width of a transistor, and the number of transistors. Areas surrounded by the broken lines in FIGS. 1A-1, 1B-1, 1C-1, 1D-1 and 1E-1 are equivalent to the areas of the unit layout cell for a transistor. However, as described later, the layout length in a pitch direction is predetermined based on the constraints. Therefore, it is necessary to elongate the unit layout cell into a height direction orthogonal to the pitch direction, in order to accommodate a conventional cell pattern.

The conventional unit layout cell pattern for a transistor will be described with reference to FIGS. 1A-1 to 1E-2. The pitch Xa of FIG. 1A-1 is the widest, and the pitches become narrower in the order of Xb of FIG. 1B-1, Xc of FIG. 1C-1, Xd of 1D-1, and Xe of FIG. 1E-1. Under the condition that the pitch is narrower than the pitch Xb of FIG. 1B-1, the unit layout cell pattern of FIGS. 1C-1, 1D-1 and 1E-1 are adopted. Which of the unit layout cell patterns of FIGS. 1C-1, 1D-1 and 1E-1 should be selected is determined based on an environment under which the unit layout cell pattern is arranged.

A layout is supposed in which a transistor with a same diffusion layer width W is repeatedly arranged within a pitch X (Xa to Xe) shown in FIGS. 1A-1 to 1E-1. In order to arrange the transistors effectively in the layout area, it is desirable to use a set of transistors. The number of transistors is determined by selecting the number of times of folding the gate electrode in accordance with the pitch.

As shown in FIGS. 2C and 2D, an array circuit 101 is connected with a memory cell array 102. The arrangement of the array circuit 101 around the memory array 102 is constrained based on the size of the memory cell array 102. For example, the area occupied by the array circuit 101 can be determined in accordance with the size of the memory cell array 102, as shown in FIG. 2C. In FIG. 2C, the array circuit 101 and the memory cell array 102 have the same length in the pitch direction. Therefore, the lengths of wiring lines, each of which connects between a corresponding one of the unit layout cells of the array circuit 101 and a corresponding portion of the memory array 102, are equal to each other, as shown in FIG. 2A-2 by arrows. Thus, signals can be uniformly propagated. On the other hand, when each of the layouts shown in FIGS. 1C-2, 1D-2, and 1E-2 can be arranged in the area of the array circuit 101 of FIG. 2C, the characteristic of this memory cell array 102 is sometimes deteriorated. This is because the layouts with smaller pitches shown in FIGS. 1D-2 and 1E-2 are arranged regardless that there is a margin in the pitch direction in relation with the memory cell array 102. At this time, the arrangement of the array circuit 101 is achieved as shown in FIG. 2D. The wiring lines, each of which connects between one unit layout cell of the array circuit 101 and a corresponding portion of the memory cell array 102, are bent as shown in FIGS. 2B-2 and 2D by the arrows. This results in non-uniform signal propagation. Therefore, in such a case, the layout of FIG. 1C-2 should be adopted.

By the way, when the source nodes of each transistor are connected with a same power supply line or a same ground line, the sources can be shared. When an output signal is outputted from each of drain nodes of the transistor, it is desirable that the drain nodes cannot be shared. In case of FIGS. 1A-2, and 1D-2, because the number of the gate electrodes extending in the height direction is even, all the source nodes can be shared, as shown by a symbol KS.

On the other hand, in case of FIG. 1B-2, because the number of the gate electrodes in the height direction is three, which is odd, the source nodes on only the one side can be made common, as shown by a symbol BS. However, as shown in a symbol BF, it is not possible to share the drain nodes. Therefore, a margin is further needed between the diffusion layers of adjacent unit layout cell patterns. That is, when one unit layout cell pattern with the gate electrodes of the odd number is repeatedly arranged, the drain nodes cannot be shared. Therefore, a field must be divided in the position shown by the symbol BF, and a space between the drain nodes or the margin between the diffusion layers becomes necessary, resulting in the decrease of layout efficiency.

As described above, when a given pitch is narrower than Xb of FIG. 1B-1 and is as much as the pitch Xc of FIG. 1C-1, a margin between the diffusion layers is insufficient in case that the number of the gate electrodes is three. Therefore, it is necessary that the number of the gate electrodes is two, as shown in FIG. 1C-1. In this case, the unit layout cell patterns of FIGS. 1D-1 and 1E-1 cannot be adopted sometimes, instead of the unit layout of FIG. 1C-1, for the reason described above. In the unit layout cell pattern of FIG. 1C-1, both sides of the diffusion layer are left as wasteful areas, and the layout area increases, compared with the case of the unit layout cell pattern of FIG. 1B-1. Also, the unit layout cell pattern of FIG. 1C-1 has a problem that the pattern height becomes high to keep the characteristic of the array circuit, compared with the unit layout cell pattern of FIG. 1B-1.

With the cell pattern repeatedly arranged, when the number of the gate electrodes in the cell pattern is odd, there is a case that the cell pattern cannot be arranged repeatedly in a predetermined field length. In such a case, the number of the gate electrodes is decreased by one such that the number of the gate electrodes is even, and then the arrangement of the cell pattern is carried out as shown in FIG. 1C-2. However, in this case, the problem of layout efficiency is not improved.

In conjunction with the above description, a semiconductor device is disclosed in Japanese Laid Open Patent Application (JP-A-Heisei 11-163642). In the semiconductor device of this conventional example, a unit transistor pattern is repeatedly arranged such that a source, a gate, a drain, a gate are repeatedly arranged in this order, and a ground pattern is provided. All the adjacent sources of the unit transistors are connected, all the gates of the adjacent unit transistors are connected, and the drains of the unit transistors are connected.

SUMMARY OF THE INVENTION

Therefore, an object of the present invention is to provide a semiconductor integrated circuit device in which a unit layout cell pattern can be arranged repeatedly in high layout efficiency in an area.

Another object of the present invention is to provide a semiconductor integrated circuit device, in which repetitive arrangement of a unit layout cell pattern is applied to an array circuit around of a memory cell array.

Another object of the present invention is to provide a design method of a semiconductor integrated circuit device, in which a unit layout cell pattern can be arranged repeatedly in high layout efficiency in an area, and the repetitive arrangement is applied to an array circuit around of a memory cell array.

In an aspect of the present invention, a semiconductor integrated circuit device with a transistor include: a single diffusion layer; and a gate base electrode provided outside of the diffusion layer to extend in a pitch direction. N (N is an odd positive integer) gate electrodes are provided above the diffusion layer in parallel in the pitch direction to extend from the gate base electrode in a height direction orthogonal to the pitch direction to pass through the diffusion layer. Source nodes are provided on the diffusion layer along one of the N gate electrodes on a side outside the N gate electrodes in a direction opposing to the pitch direction as a head gate electrode. Drain nodes are provided on the diffusion layer along another of the N gate electrodes on a side outside the N gate electrodes in the pitch direction as a last gate electrode. The drain nodes are less than the source nodes.

In this case, the diffusion layer may have a first rectangular portion and a second rectangular portion protruding from the first rectangular portion in the pitch direction and smaller than the first rectangular portion. The gate electrodes other than the last gate electrode extend over the first rectangular portion and the last gate electrode extends over the second rectangular portion.

Also, the length of the second rectangular portion in the height direction may be less than a half of a length of the first rectangular portion in the height direction. In this case, the second rectangular portion may be provided on a side near the gate base electrode. Also, the last gate electrode may be shorter than the N gate electrodes other than the last gate electrode, or may be equal to the N gate electrodes other than the last gate electrode in length.

Also, the second rectangular portion may be provided on a side apart from the gate base electrode. In this case, the last gate electrode may be equal to the N gate electrodes other than the last gate electrode in length.

Also, a distance between the last gate electrode and the gate electrodes adjacent to the last gate electrode in the pitch direction may be wider than a distance between adjacent two of the N gate electrodes other than the last gate electrode in the pitch direction.

Also, when N is equal to or more than 3, and a group of source nodes and a group of drain nodes are alternately arranged, the first and second source nodes may be desirably connected with a same power supply line.

In another aspect of the present invention, a semiconductor integrated circuit device has a circuit comprising adjacent first and second transistors. The first transistor includes a first transistor diffusion layer, and a first transistor gate base electrode provided outside the first transistor diffusion layer in a height direction to extend in a pitch direction orthogonal to the height direction. First transistor N (N is an odd positive integer) gate electrodes are provided above the first transistor diffusion layer to extend from the first transistor gate base electrode in a direction opposing to the height direction to pass through the first transistor diffusion layer. First transistor drain nodes are provided on the first transistor diffusion layer along one of the first transistor N gate electrodes as a first transistor head gate electrode outside the first transistor N second gate electrodes. First transistor source nodes provided on the first transistor diffusion layer along one of the first transistor N gate electrodes as a last gate electrode outside the first transistor N gate electrodes. The first transistor drain nodes are less than the first transistor source nodes. Also, the second transistor includes a second transistor diffusion layer; and a second transistor gate base electrode provided outside the second transistor diffusion layer in the height direction to extend in the pitch direction. Second transistor N gate electrodes are provided above the second transistor diffusion layer to extend from the second transistor gate base electrode in the direction opposing to the height direction to pass through the second transistor diffusion layer. Second transistor source nodes are provided on the second transistor diffusion layer along one of the second transistor N gate electrodes as a second transistor head gate electrode outside the second transistor N gate electrodes. Second transistor drain nodes are provided on the second transistor diffusion layer along one of the second transistor N gate electrodes as a second transistor last gate electrode outside the second transistor N gate electrodes. Here, the second transistor second drain nodes are less than the second transistor source nodes. The first transistor source nodes are common to the second transistor source nodes, and the first transistor diffusion layer is common to the second transistor diffusion layer.

In this case, the first transistor drain nodes may be provided on a side apart from the first transistor gate base electrode, and the second transistor drain nodes may be provided on a side near the second transistor gate base electrode. Also, the first transistor drain nodes may be provided on a side near the first transistor gate base electrode, and the second transistor drain nodes may be provided on a side near the second transistor gate base electrode.

Also, the first transistor drain nodes may be provided on a side apart from the first transistor gate base electrode, and the second transistor drain nodes may be provided on a side apart from the second transistor gate base electrode.

Also, when N is equal to or more than 3, and a group of source nodes and a group of drain nodes are alternately arranged, the first and second source nodes may be desirably connected with a same power supply line.

Also, the circuit is one of a sense amplifier, a sub-word driver, a main word driver and a Y decoder contained in an array circuit, which is provided around a memory cell array and is constrained in a pitch based on a size of the memory cell array.

In another aspect of the present invention, a semiconductor integrated circuit device has adjacent first and second transistors. The first transistor includes a first transistor diffusion layer; and a first transistor gate base electrode provided outside the first transistor diffusion layer in a height direction to extend in a pitch direction orthogonal to the height direction. First transistor N (N is an odd positive integer) gate electrodes are provided above the first transistor diffusion layer to extend from the first transistor gate base electrode in a direction opposing to the height direction to pass through the first transistor diffusion layer. First transistor drain nodes are provided on the first transistor diffusion layer along one of the first transistor N gate electrodes as a first transistor head gate electrode outside the first transistor N gate electrodes. First transistor source nodes are provided on the first transistor diffusion layer along one of the first transistor N gate electrodes as a first transistor last gate electrode outside the first transistor N gate electrodes. The first transistor drain nodes are less than the first transistor source nodes. Also, the second transistor includes a second transistor diffusion layer and a second transistor gate base electrode provided outside the second transistor diffusion layer in a direction opposing to the height direction to extend in the pitch direction. Second transistor N gate electrodes are provided above the second transistor diffusion layer to extend from the second transistor gate base electrode in the height direction to pass through the second transistor diffusion layer. Second transistor source nodes are provided on the second transistor diffusion layer along one of the second transistor N gate electrodes as a second transistor head gate electrode outside the second transistor N gate electrodes. Second transistor first drain nodes are provided on the second transistor diffusion layer along one of the second transistor N gate electrodes as a second transistor last gate electrode outside the second transistor N gate electrodes. The second transistor drain nodes are less than the second transistor source nodes. The first transistor source nodes are common to the second transistor source nodes, and the first transistor diffusion layer is common to the second transistor diffusion layer.

Here, the first transistor drain nodes may be provided on a side apart from the first transistor gate base electrode, and the second transistor drain nodes may be provided on a side near the second transistor gate base electrode.

Also, the first transistor drain nodes may be provided on a side near the first transistor gate base electrode, and the second transistor drain nodes may be provided on a side near the second transistor gate base electrode.

Also, the first transistor drain nodes may be provided on a side apart from the first transistor gate base electrode, and the second transistor drain nodes may be provided on a side apart from the second transistor gate base electrode.

Also, when N is equal to or more than 3, and a group of source nodes and a group of drain nodes are alternately arranged, the first and second source nodes may be desirably connected with a same power supply line.

Also, the circuit is one of a sense amplifier, a sub-word driver, a main word driver and a Y decoder contained in an array circuit, which is provided around a memory cell array and is constrained in a pitch based on a size of the memory cell array.

In another aspect of the present invention, there is provided a method of designing a semiconductor integrated circuit device with a first circuit having a first cell pattern for a transistor arranged repeatedly. The first circuit is provided in association with a second circuit, the transistor has a gate base electrode and a plurality of gate electrodes connected with the gate base electrode. The gate base electrode and the plurality of gate electrodes are provided above a diffusion layer. The method is be achieved by (a) determining a length of the first circuit in a pitch direction based on a size of the second circuit; by (b) determining a pitch of the first cell pattern based on the determined length of the first circuit; by (c) determining a number of the plurality of gate electrodes; by (d) arranging the first cell pattern with the plurality of gate electrodes of the determined number; by (e) arranging a second cell pattern for another transistor corresponding to the first cell pattern such that the diffusion layer of the first cell pattern and a diffusion layer of the second cell pattern are made common.

Here, the (e) arranging step may include arranging the second cell pattern such that source nodes of the first cell pattern are made common to source nodes of the second cell pattern.

Also, the number of the plurality of gate electrodes is odd when the cell pattern has a first pitch and a first height, and the diffusion layer has a first rectangular portion and a second rectangular portion protruding from the first rectangular portion and smaller than the first rectangular portion. The plurality of gate electrodes other than the last gate electrode pass over the first rectangular portion and only the last gate electrode passes over the second rectangular portion.

Also, the (b) determining step may be achieved by setting a layout rule, wherein a distance between the gate electrode and the diffusion layer is a, a width of the gate electrode is b, a diameter of a contact formed on the diffusion layer is c, and a distance between the contact and an end of the diffusion layer is d, a distance between the contact and an end of the gate electrode is e, and a distance between adjacent diffusion layers is f; by determining a first pitch Xα from the following equation (1) based on the layout rule, $$X\alpha = N \cdot (b+c+2e) + c/2 + d + f/2 \quad (1)$$

Where N is an odd number; by determining a second pitch Xβ from the following equation (2) based on the layout rule, $$X\beta = [2(N+1) \cdot b + 2(N+1)c + 2\{2(2N+1)-1\}e \cdot 3a + 3d]/2 \quad (2)$$

Where N is an even number; by determining whether a pitch of the cell pattern is equal to or longer than the Xα and less than the Xβ; and by determining the pitch of the cell pattern, when the pitch of the first cell pattern is equal to or longer than the Xα and less than the Xβ.

In another aspect of the present invention, there is provided a recording medium storing a computer program for a method of designing a semiconductor integrated circuit device with a first circuit having a first cell pattern for a transistor arranged repeatedly. The first circuit is provided in association with a second circuit, the transistor has a gate base electrode and a plurality of gate electrodes connected with the gate base electrode. The gate base electrode and the plurality of gate electrodes are provided above a diffusion layer. The method is be achieved by (a) determining a length of the first circuit in a pitch direction based on a size of the second circuit; by (b) determining a pitch of the first cell pattern based on the determined length of the first circuit; by (c) determining a number of the plurality of gate electrodes; by (d) arranging the first cell pattern with the plurality of gate electrodes of the determined number; by (e) arranging a second cell pattern for another transistor corresponding to the first cell pattern such that the diffusion layer of the first cell pattern and a diffusion layer of the second cell pattern are made common.

BRIEF DESCRIPTION OF THE DRAWINGS

FIGS. 1A-1 to 1E-1 are diagrams showing conventional unit layout cell patterns, and FIGS. 1A-2 to 1E-2 are diagrams showing layout patterns when the conventional unit layout cell patterns are repeatedly arranged;

FIGS. 2A-1 and 2B-1 are diagrams showing same unit layout cell pattern;

FIGS. 2A-2 and 2B-2 are diagrams showing the state in which the unit layout cell pattern of FIGS. 2A-1 and 2B-1 are arranged repeatedly, respectively;

FIG. 6 is a table showing relation among a pitch, the number of gate electrodes and a height in the semiconductor integrated circuit device according to the first embodiment of the present invention;

FIG. 7 is a table showing an example of a pitch, the number of gate electrodes and a height in the semiconductor integrated circuit device according to the first embodiment of the present invention;

FIG. 10 is a circuit diagram showing the array circuit shown in FIG. 9;

DESCRIPTION OF THE PREFERRED EMBODIMENTS

Hereinafter, a semiconductor integrated circuit device and a designing apparatus of the present invention will be described with reference to the attached drawings.

Figure 12:
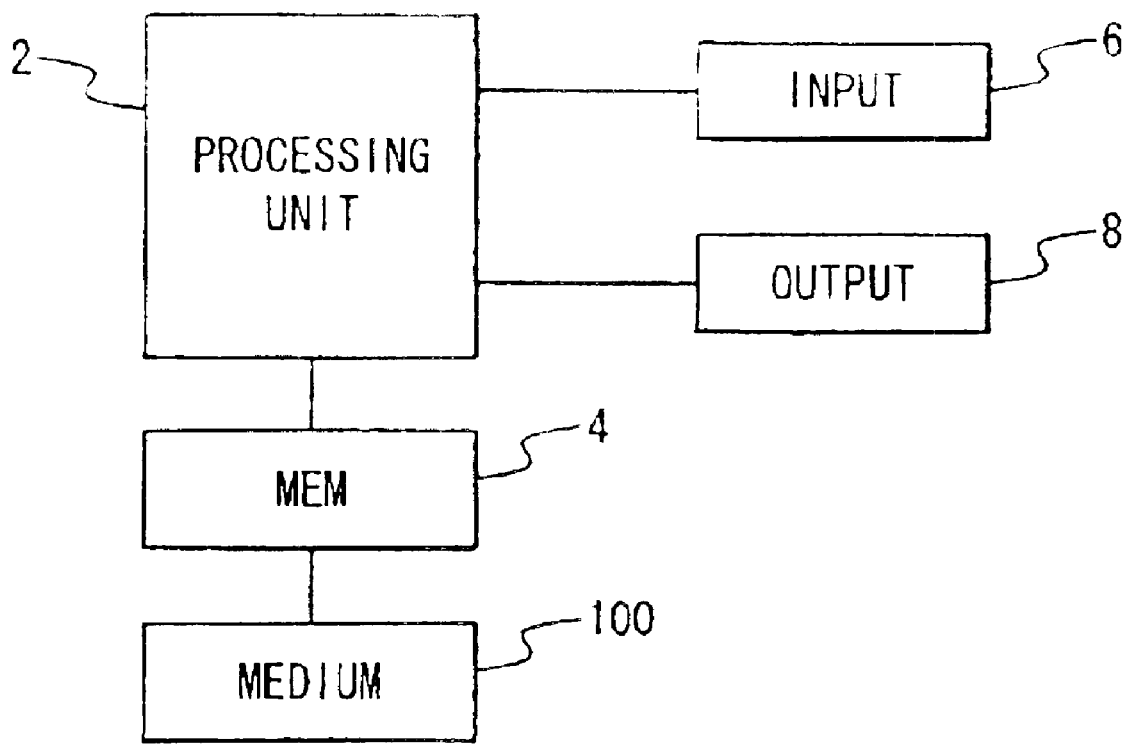
FIG. 12 is a block diagram showing a system configuration of a designing apparatus of the present invention.

Referring to FIG. 12, the designing apparatus is composed of a processing unit 2, a memory (a database) 4, an input unit 6, an output unit (a display) 8 and a recording medium 100. The input unit 6 is used to input an instruction and data. The processing unit 2 operates based on a program loaded from the recording medium 100. The processing unit 2 selects an optimal unit layout cell pattern from the database 4 in response to the instruction and the data supplied from the input unit 6, and controls the display 8 to display the selected cell pattern in a predetermined area.

Figures 1, 2A:
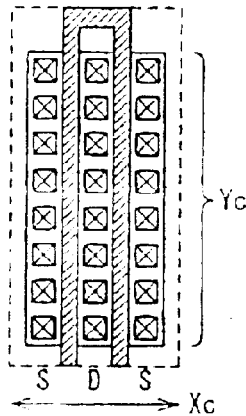
Figures 2, 2A:
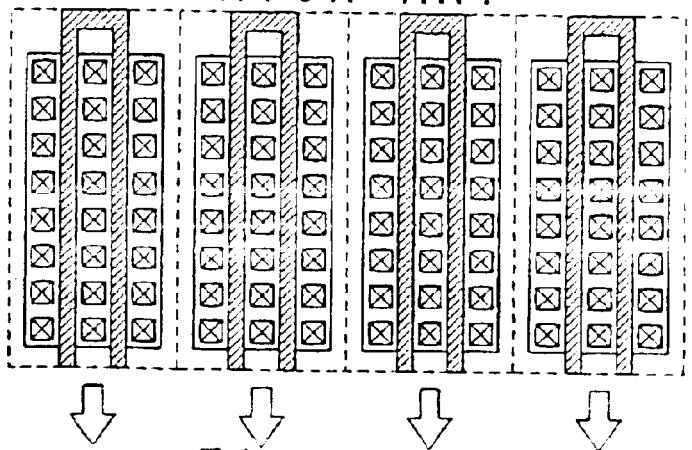
Figures 1, 2B:
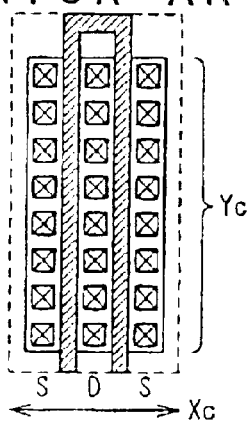
Figures 2, 2B:
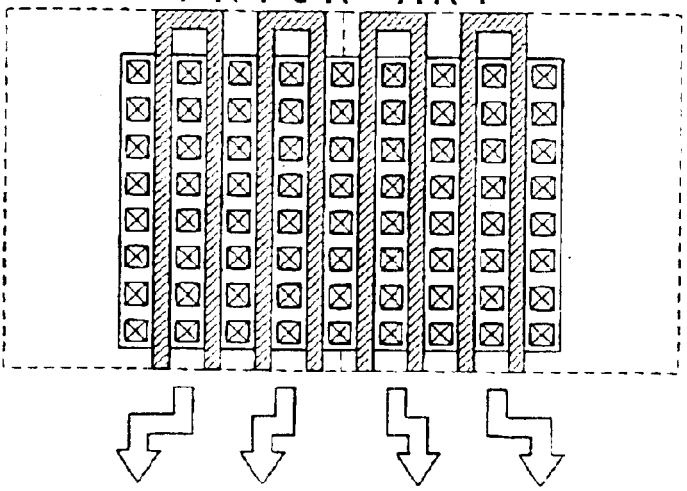
Figure 2C:
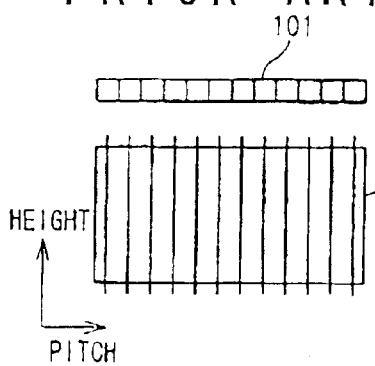
FIGS. 2C and 2D are diagrams showing relations between an array circuit and a memory cell array.
Figure 2D:
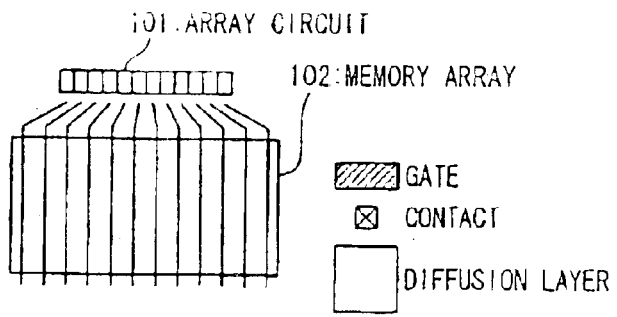
Figure 3A:
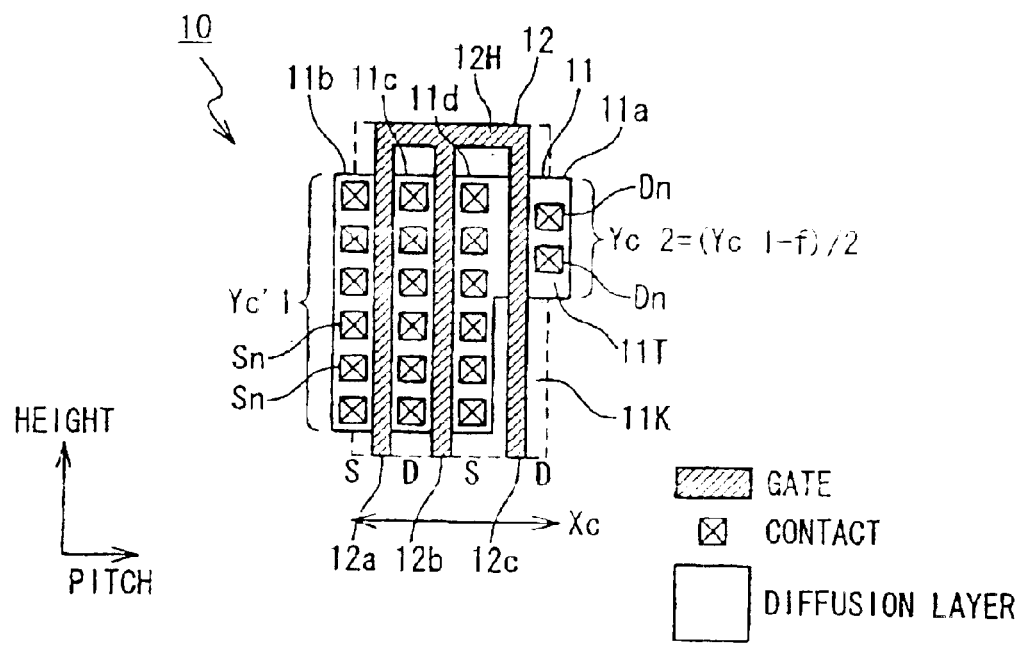
FIG. 3A is a diagram showing a unit layout cell pattern used for manufacturing a semiconductor integrated circuit device according to a first embodiment of the present invention.
Figure 3B:
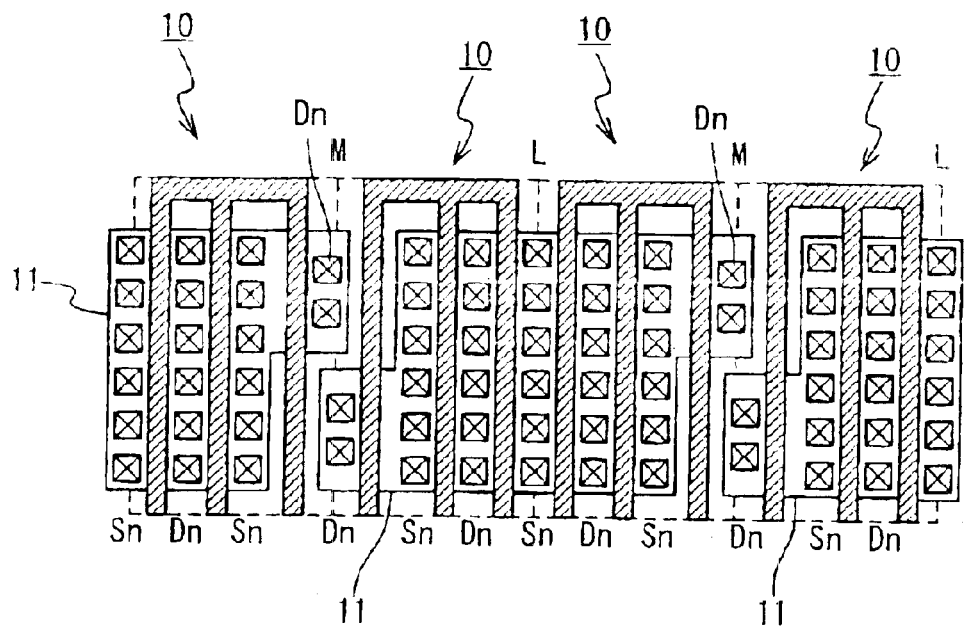
FIG. 3B is a diagram showing a state in which the unit layout cell pattern of FIG. 3A is used.

Conventionally, there is a case that the unit layout cell pattern with gate electrodes of the odd number (2n+1) extending in a height direction cannot be arranged in an area with a predetermined pitch. This cell pattern corresponds to the unit layout cell pattern shown in FIG. 1B-1. If the pitch is smaller compared with a predetermined height, a space between the diffusion layers cannot be secured in the position of the symbol BF, as shown in FIG. 1B-2. In this case, the layout rule cannot be satisfied, and the cell pattern cannot be adopted. In this way, in such a case, a unit layout cell pattern is selected so that it can be arranged repeatedly. Such unit layout cell pattern has gate regions for the gate electrodes of an even number and a half of one gate region, namely, (2n+0.5) gate regions, as shown in FIG. 3A. Here, the gate electrode corresponding to the half gate region extends to a same height length as the remaining gate electrodes. In this case, the arrangement of the unit layout cell pattern shown in FIG. 3A can be efficiently carried out. In the structure shown in FIG. 3A, the diffusion layer for a transistor can be made common in the source node in one side, as shown in FIG. 3B by a symbol L). Thus, the height of the cell pattern can be reduced, compared with the conventional structure of FIG. 1C-1.

In the conventional method, there is a case that the unit layout cell pattern with the gate electrodes of an odd number cannot be arranged in an area of a predetermined pitch, that is, when the space BF cannot be secured between the diffusion layers (the symbol BF of FIG. 1B-2). In this case, the unit layout cell pattern with the gate electrodes of an even number is arranged repeatedly. In the arrangement shown in FIG. 1C-2, the diffusion layer cannot be shared to keep the characteristic of the array circuit. Therefore, although a margin is in the pitch direction, the height of the cell cannot be made small. Thus, the layout efficiency is not good. The diffusion layer cannot be shared at all in the structure shown in FIG. 1C-2, unlike the layout shown in FIG. 3B and FIG. 1B-2.

For this reason, in this embodiment, a diffusion layer on the drain node side is formed in the shape of a wedge, while source nodes can be shared by transistors, as shown in FIG. 3B and FIG. 1B-2. The unit layout cell pattern has a shape that a part of the drain diffusion region of the MOS transistor sticks out from the pitch but the drain diffusion regions of the adjacent transistors do not overlap each other (see a symbol M). Thus, the width (W) of the layout area can be used efficiently. Also, the height of the layout area can be reduced, while maintaining the characteristic, compared with the case shown in FIG. 1C-2.

The diffusion layer formed in the wedge shape between the adjacent transistors on the drain node side is alternately arranged in the height direction (see the symbol M). At this time, the gate is divided into three gate electrodes, and one of them passes on the half diffusion region. Therefore, the gate is equivalent to 2.5 gate electrodes.

When the structure shown in FIG. 1C-1 is employed, the unit layout cell pattern can be arranged efficiently while a space between the diffusion layers on the side of the drain node of the transistors is ensured and the increase of the height in a predetermined pitch is suppressed. Therefore, the layout area can be made small compared with the pattern shown in FIG. 1C-1 in which the number of the gate electrodes is two. Especially, the layout area can be made small when the same circuit pattern is repeatedly arranged, like the circuit connected with the memory array.

Next, the pattern structure of FIG. 3A will be described in detail.

As shown in FIG. 3A, the unit layout cell pattern 10 in this embodiment is formed in correspondence to a single layout area surrounded by a broken line and regarded as a polygon in a plan view Three gate electrodes 12a, 12b and 12c extend in a height direction from a gate base electrode 12H in the layout area and are provided in parallel in the pitch direction. A first end portion 11a of the layout area 11 extends in a height direction outside of the gate electrode 12c. A plurality of drain nodes Dn are provided for the first end portion 11a, A second end portion 11b of the layout area 11 extends in the height direction outside of the gate electrode 12a. A plurality of source nodes Sn are provided for the second end portion 11b. The length Yc'2 of the first end portion 11a in the height direction orthogonal to the pitch direction in the layout area 11 is shorter than the length Yc'1 of the second end portion 11b.

As shown in FIG. 3B by the symbol L, when the unit layout cell pattern 10 is repeatedly arranged, the diffusion layers 11 of the adjacent unit layout cell patterns 10 are made common such that parts of the source node Sn of the adjacent unit layout cell patterns 10 are made common. The third and fourth portions 11c and 11d of the diffusion layer 11 extend in the height direction between the gate electrodes 12a and 12c. A plurality of drain nodes Sn are provided for the third portion 11c, and a plurality of source nodes Sn are provided for the fourth portion lid. The width of the third portion 11c between the gate electrodes 12a and 12b is shorter than the width of the fourth portion 11d between the gate electrodes 12b and 12c.

The diffusion layer 11 is composed of a project portion 11T and a notch portion 11K. The project portion 11T corresponds to the first end portion 11a and a part of the project portion 11T protrudes from the layout area. The notch portion is provided a portion of the layout area corresponding to the fourth portion 11d other than the project portion 11T. That is, the diffusion layer 11 is composed of a first rectangular area and a second rectangular area 11T protruding from the first rectangular area and smaller than the first rectangular area. The project portions 11T of the adjacent unit layout cell pattern 10 is arranged in the notch section 11K of the unit layout cell pattern 10. The Two gate electrodes 12a and 12b passes on the first rectangular area and only a part of the gate electrode 12c passes on the second rectangular area 11T. As shown in FIG. 3A, one 12c of the three gate electrodes 12a, 12b and 12c of the unit layout cell pattern 10 is formed to pass on the notch section 11K.

To be described later, when the number of the gate electrodes is odd, the layout area can be made small by selecting two kinds of patterns shown in FIGS. 3A and 1B-1 based on the pitch length, compared with the conventional example.

Next which of the two kinds of the unit layout cell patterns shown in FIGS. 1C-1 and 1B should be selected will be described with reference to FIGS. 2 to 5. This process is carried out by the processing unit 2.

The structures of the above two kinds are determined based on the values of the layout rule which are determined based on the rule of the semiconductor manufacture process. The parameters to be used at the time are a diffusion layer width W, a gate diffusion layer interval a, a gate width b, a contact diameter c, a contact diffusion layer interval d, a contact gate e, a diffusion layer diffusion layer interval f as shown in FIG. 4.

Based on the layout length in the pitch direction determined from the memory cell array and various parameters of the layout rule, the shape of the diffusion layer and the number of the gate electrodes can be selected, containing which of the two kinds of structures shown in FIGS. 3A and FIG. 1B-1 should be selected.

Figure 4:
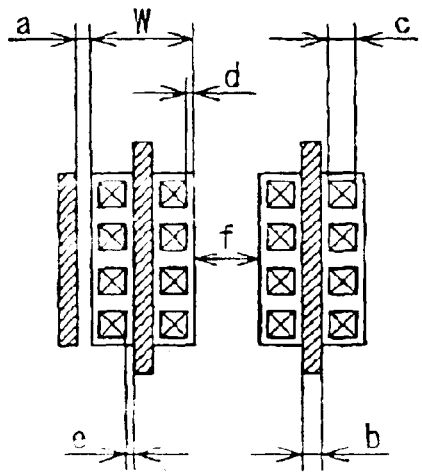
FIG. 4 is a diagram showing parameter sets used in a layout rule determined based on the rule of a semiconductor manufacturing process.
Figure 5:
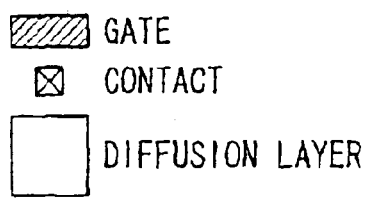
FIG. 5 is a table showing an example of parameter sets.

FIG. 5 is a table showing an example of the numerical values of the typical layout rule shown in FIG. 4, i.e., various parameters. FIG. 4 is a table showing which of the shapes of diffusion layers shown in FIGS. 1A-1 to 1E-1 and FIG. 3A should be selected in accordance with the length of the pitch X. FIG. 7 is a table showing the change of the area in the numerical value example of FIG. 5 when the shape of the diffusion layer is selected in accordance with the length of the pitch X.

As shown in FIG. 5, the typical layout rule is as follows:

| | |
|---|---|
| w: diffusion layer width | 10.00 $\mu$m; |
| a: gate-the diffusion layer interval | 0.10 $\mu$m; |
| b: gate width | 0.20 $\mu$m; |
| c: contact diameter | 0.20 $\mu$m; |
| d: contact - diffusion layer interval | 0.10 $\mu$m; |
| e: contact - gate | 0.10 $\mu$m; and |
| f: diffusion layer - diffusion layer interval | 0.40 $\mu$m. |

As shown in FIG. 6, which of the shapes of diffusion layers shown in FIG. 1A-1 to 1E-1 and 3A should be selected is determined based on the pitch X determined (constrained) from the size of the memory cell array. That is the diffusion layer shape is determined based on which of the pitches X of ① to ⑤ the pitch X belongs to.

As shown in FIG. 6, first, whether the pitch X determined from the memory cell array is ⑤ N·(b+c+2e) (N=4) is checked. Specifically, as shown in FIG. 7, whether the pitch length is 2.40 $\mu$m is checked in the numerical value example of FIG. 5. If the pitch X is longer than ⑤ N·(b+c+2e) (N=4), the unit layout cell pattern is selected to have four gate electrodes as shown in FIG. 1A-1. In this case, the height is Ya=W/4 (2.55 in the numerical value example of FIG. 5 as shown in FIG. 7). In this case, the area is X·Ya=6.00 $\mu$m$^2$ in the numerical value example of FIG. 5, as shown in FIG. 7.

If the pitch X is less than ⑤ N·(b+c+2e) (N=4), whether the pitch X is equal to or more than ④ N(b+c+2e)+c/2+d+f/2 (N=3) is checked, that is, whether the pitch is equal to or longer than 2.20 in the numerical value example of FIG. 5 is checked, as shown in FIG. 7. If the pitch X is equal to or longer than ④ N(b+c+2e)+c/2+d+f/2 (N=3) as the result of the check, the unit layout cell pattern is selected to have three gate electrodes as shown in FIG. 1B-1. In this case, the height is Yb=W/3, i.e., 3.33 as shown in FIG. 7 in the numerical value example of FIG. 5. In this case, the area is X·Yb=7.33 $\mu$m$^2$ as shown in FIG. 7 in the numerical value example of FIG. 5.

If the pitch X is less than ④ N(b+c+2e)+c/2+d+f/2 (N=3), whether the pitch X is longer than ③[2(N+1)·b+2(N+1)c+2{2(2N+1)−1}e·3a+3d]/2 (N=2) is checked, that is, whether the pitch is equal to or longer than 2.00 in the numerical value example of FIG. 5 as shown in FIG. 7. If the pitch X is equal to or longer than ③ [2(N+1)·b+2(N+1)c+2{2(2N+1)−1}e·3a+3d]/2 (N=2), the unit layout cell pattern is selected to have the 2.5 gate electrodes as shown in FIG. 3A. In this case, the height is Y=(2W+f)/(2×2+1), i.e., 4.08 as shown in FIG. 7 in the numerical value example of FIG. 5. In this case, the area is X·Y=8.16 $\mu$m$^2$ as shown in FIG. 7 in the numerical value example of FIG. 5.

Conventionally, when the pitch X is shorter than ④ N(b+c+2e)+c/2+d+f/2 (N=3) and is equal to or longer than ③ [2(N+1)·b+2(N+1)c+2{2(2N+1)−1}e·3a+3d]/2 (N=2), the unit layout cell pattern with gate electrodes shorter by two as shown in FIG. 1C is employed. In this case, the height is Yc=W/2, i.e., 5.00 as shown in FIG. 7 in the numerical value example of FIG. 5. In this case, the area is X·Yc=10.00 $\mu$m$^2$ as shown in FIG. 7 in the numerical value example of FIG. 5.

On the other hand, in this embodiment, when the pitch X is shorter than ④ N·(b+c+2e)+c/2+d+f/2 (N=3) and is longer than ③ [2(N+1)·b+2(N+1)c+2{2(2N+1)−1}e·3a+3d]/2 (N=2), the diffusion layer shape is changed with no change of the number of gate electrodes, i.e., 2.5 gate electrodes.

When the pitch X is shorter than ③ [2(N+1)·b+2(N+1)c+2{2(2N+1)−1}e·3a+3d]/2 (N=2), whether the pitch X is longer than ② N·(b+c+2e)(N=2) is checked, that is, whether the pitch is equal to or longer than 1.20 is checked in the numerical value example of FIG. 5 as shown in FIG. 7. If the pitch X is equal to or longer than ② N·(b+c+2e) (N=2) as the result of the check, the unit layout cell pattern is formed such that the number of the gate electrodes as shown in FIG. 11(D) is two. In this case, the height Yd=W/2, i.e., 5.00 as shown in FIG. 5 in the numerical value example of FIG. 3. In this case, the area is X·Yd=6.00 as shown in FIG. 5 in the numerical value example of FIG. 3.

When the pitch X is shorter than ② N·(b+c+2e) (N=2) as the result of the above check, whether is the pitch X ① N·(b+c+2e)+c/2+d+f/2 (N=1) is checked, that is, whether the pitch is equal to or longer than 1.00 is checked in the numerical value example of FIG. 3 as shown in FIG. 5. If the pitch X is equal to or longer than ① N·(b+c+2e)+c/2+d+f/2 (N=1), the unit layout cell pattern is selected such that the number of gate electrodes is one as shown in FIG. 1E-1. In this case, the height is Ye=W/1, i.e., 10.00 as shown in FIG. 7 in the numerical value example of FIG. 5. In this case, the area is X·Ye=10.00 m² as shown in FIG. 7 in the numerical value example of FIG. 5.

As described above, conventionally, when the pitch is decreased from ⑤ N·(b+c+2e)(N=4) and is shorter than ④ N(b+c+2e)+c/2+d+f/2 (N=3), the number of the gate electrodes is three, and the unit layout cell pattern cannot be arranged. For this reason, the unit layout cell pattern with two gate electrodes is used, as FIG. 1C-1.

In the present invention, when the pitch is shorter than ④ N(b+c+2e)+c/2+d+f/2 (N=3), the diffusion layer shape of the unit layout cell pattern is changed while keeping the three gate electrodes (the number of the gate electrodes is 2.5), and the unit layout cell pattern is arranged. It should be noted that the length of the project portion 11T of the wedge shape is Yc'2=(Yc'1−f)/2 at maximum.

As the above result, when the pitch is shorter than ④ pitch and equal to or longer than ③ pitch, the height of the cell pattern can be made short, compared with the conventional example, and the layout area can be made small (see FIG. 7). That is, in this case, as shown in ③' of FIG. 6, the height can be made (2W+f)/(2N+1). Because W>>f, 2W/(2N+1)=W/(N+1/2) Because N=2, W/(N+1/2)=W/2.5Here, in the conventional ③, the height to the number of gate electrodes N is given as W/N. On the other hand, in ③' of the this embodiment, because the height is W/2.5 and the number of the gate electrodes is equivalent to 2.5.

Figure 8:
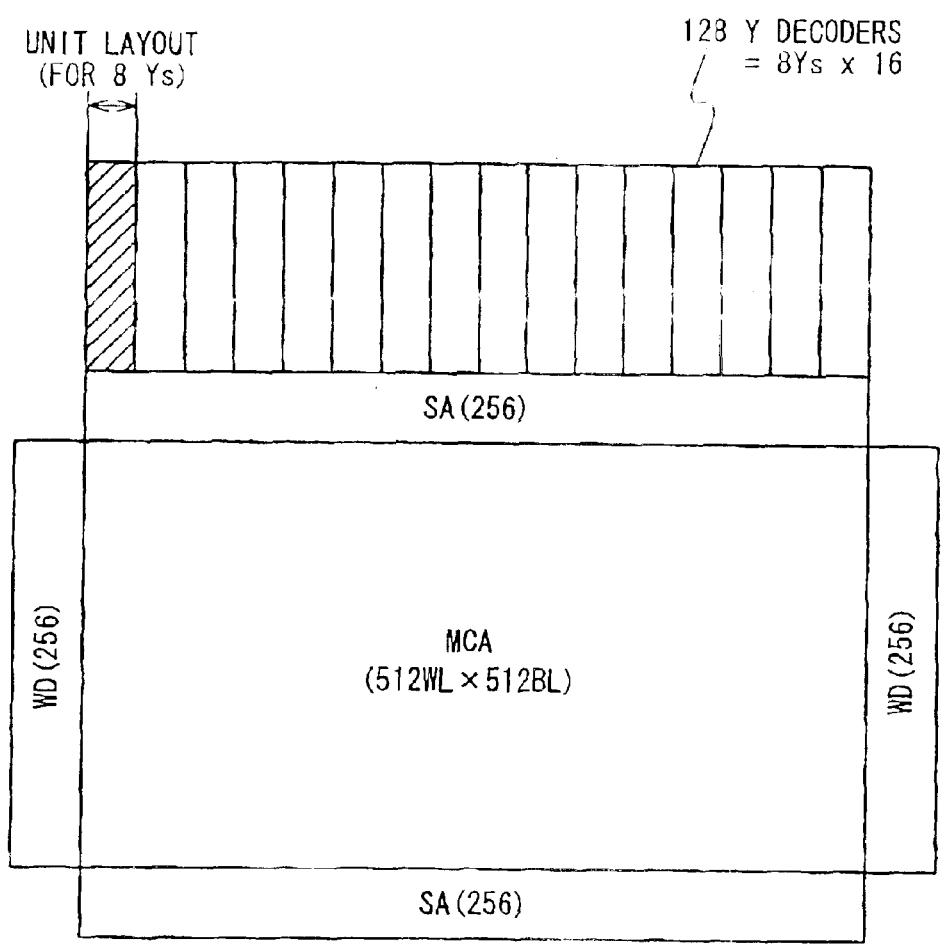
FIG. 8 is a diagram showing position relation between a memory array and an array circuit.

FIG. 8 shows a memory array MCA (512*WL512WL). As the peripheral circuits, a word driver WD, a sense amplifier SA, a Y decoder YDEC are arranged. The layout of this embodiment is used for this Y decoder YDEC. In other words, because the sense amplifier SA, the Y decoder YDEC, the word driver WD are the circuit attached to the memory array MCA, their layout is limited to the size of the memory array MCA. Supposing that the size of the memory array MCA Is XY, each circuit needs to be put back in the pitch, e.g., Y/256 in case of the sense amplifier SA, Y/128 in case of the Y decoder YDEC, and X/256 in case of the word driver WD. It should be noted that the number of bit lines and the number of word lines are 256 respectively because they are drawn out on the both edges of the memory array MCA.

Figure 9:
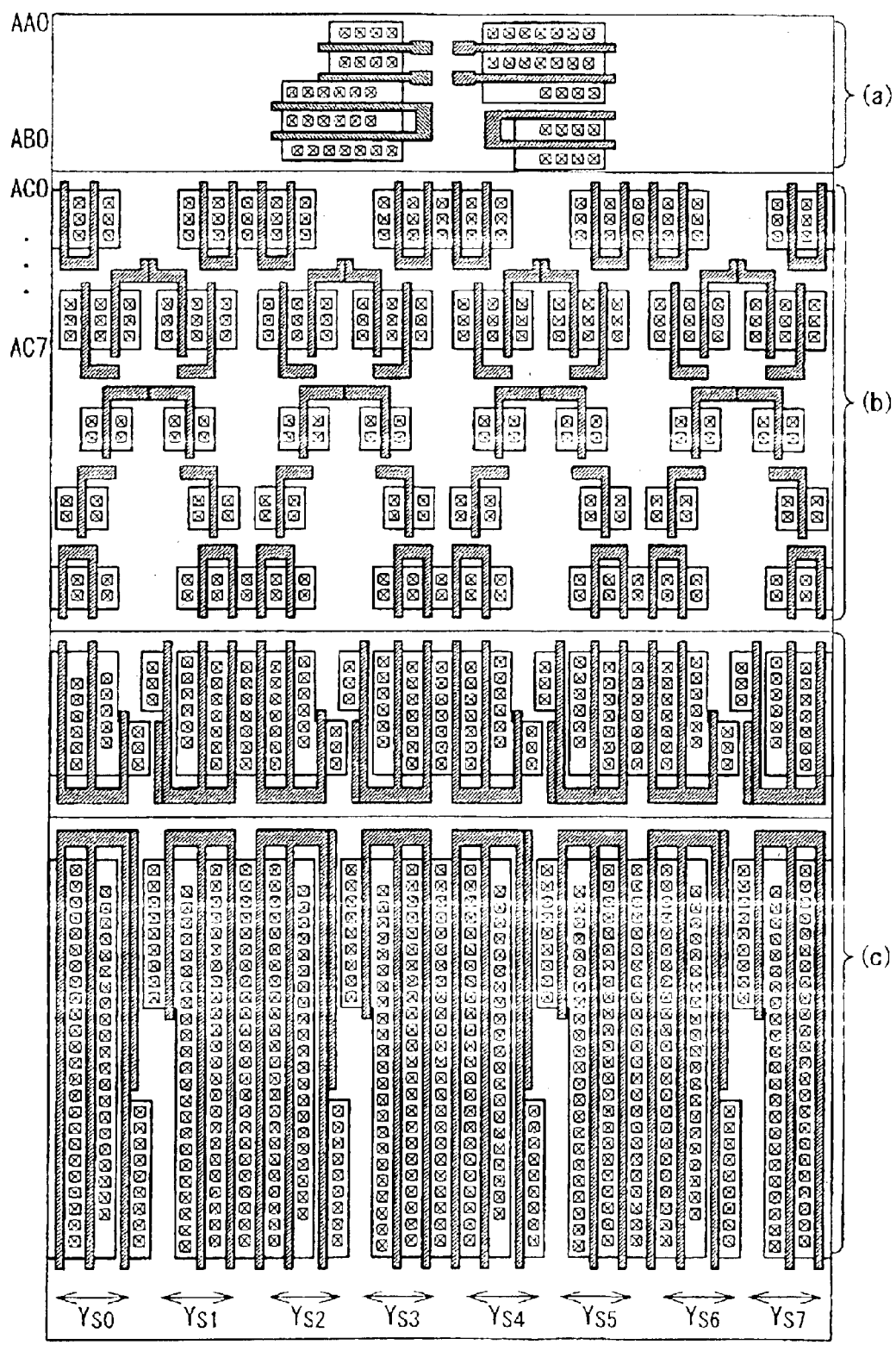
FIG. 9 is a diagram showing a specific example of a pattern of the array circuit in the semiconductor integrated circuit device according to the first embodiment of the present invention.

The output of the Y decoder YDEC is commons to the two sense amplifiers SA and is 128. The 128 Y decoders. YDEC are composed of 16 Y switch groups. A part shown by the slanted line in FIG. 8 is the one Y switch group and corresponds to the unit layout cell pattern of the Y decoder YDEC. FIG. 9 shows one unit layout cell pattern (the Y switch group). One unit layout cell pattern (the Y switch group) has eight Y switches (Ys0 to Ys7 in FIG. 9) as shown in FIGS. 8 and 9. That is, the structure of the Y decoder YDEC becomes 8 (the number of the Y switches contained in the single unit layout cell pattern)×16 (the number of the unit layout cell pattern)=128. It should be noted that the Y switch is an NMOS which connects the bit line BL and the I/O line in the sense amplifier SA.

Also, because each memory cell is identical, the layout of the Y decoder YDEC needs to be uniform. Also, to restrain the area of the Y decoder YDEC, it is necessary to make the height low.

In FIGS. 9 and 10, (a) is a common circuit to eight Ys, (b) is a front-stage circuit and (c) is a final stage inverter. Inputs AA0, AB0, AC0, . . . , AC7 indicate a Y address and Ys0, . . . , Ys7 are Y switches. The present invention is used for the layout of the inverter of the final stage of the Y decoder YDEC, i.e., the circuit (c) of FIGS. 9 and 10.

According to this embodiment, the number of the gate electrodes cannot be kept odd because of the limitation on the pitch, and needs to be even (for example, FIG. 1B-1). However, the problem of the increase of the height and the problem of the signal propagation delay of the Y switch can be solved in relation to the memory array MCA. In this way, when the number of the gate electrodes is odd to W of the transistor and the pitch, the diffusion layer shape is changed to have the wedge form and is arranged repeatedly in this embodiment.

A modification example of this embodiment will be described with reference to FIGS. 11A to 11C.

Figure 11A:
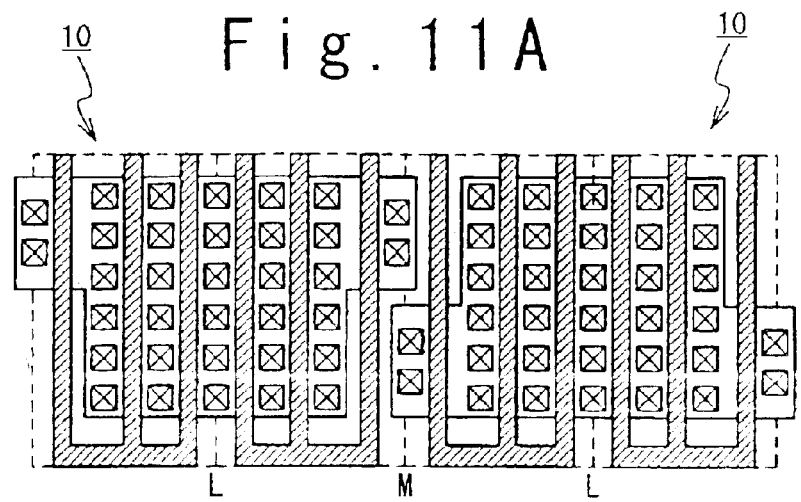
FIGS. 11A to 11C are diagrams showing arrangements of unit layout cell patterns used in the semiconductor integrated circuit device according to other embodiments of the present invention.
Figure 11B:
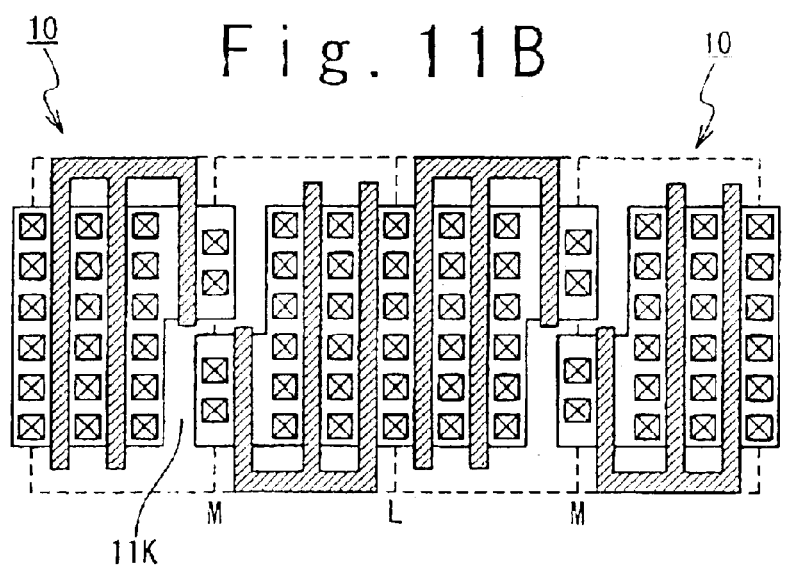
Figure 11C:
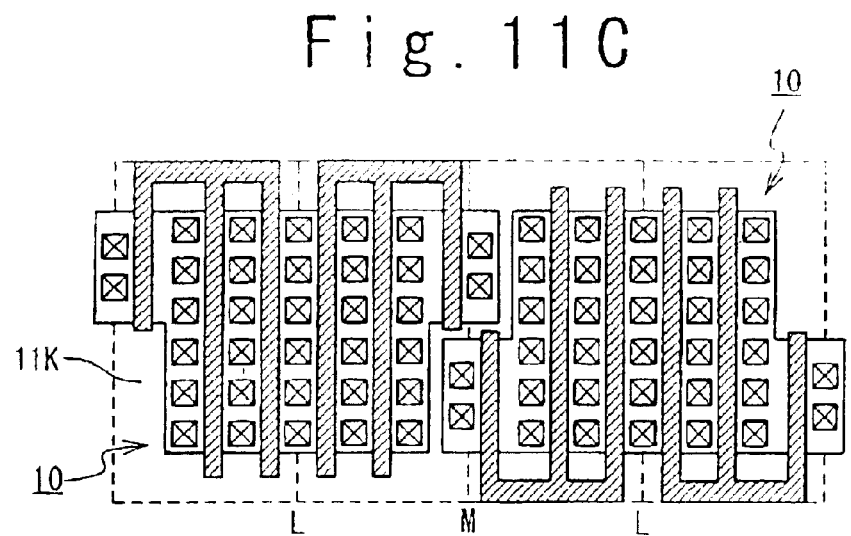

In addition to the diffusion layer shape of FIG. 3A, the shapes shown in FIG. 11A, 11B and 11C are proposed. The shape shown in FIG. 11A is one of modifications of the diffusion layer shape shown in FIG. 3A. In the unit layout cell patterns shown in FIGS. 11B and 11C, there is no gate electrode between the diffusion layers of the adjacent unit layout cell patterns, and the position of the gate base electrode as the taking-out wiring line of the gate became alternate for every one or for every two. The optimal of them can be selected based on the whole circuit structure and the layout rule.

As shown in FIGS. 11B and 11C, the unit layout cell pattern is formed such that the gate electrode 12c as one of the gate electrodes 12a, 12b and 12c does not pass on the notch section 11K.

According to the present invention, a unit layout cell pattern can be arranged in a high efficiency.

What is claimed is:

1. A semiconductor integrated circuit device with a transistor comprising:
    a single diffusion layer;
    a gate base electrode provided outside of said diffusion layer to extend in a pitch direction;
    N (N is an odd positive integer) gate electrodes provided above said diffusion layer in parallel in said pitch direction to extend from said gate base electrode in a height direction orthogonal to said pitch direction to pass through said diffusion layer;
    source nodes provided on said diffusion layer along one of said N gate electrodes on a side outside said N gate electrodes in a direction opposing to said pitch direction as a head gate electrode; and drain nodes provided on said diffusion layer along another of said N gate electrodes on a side outside said N gate electrodes in said pitch direction as a last gate electrode, wherein said drain nodes are less than said source nodes.

2. The semiconductor integrated circuit device according to claim 1, wherein said diffusion layer has a first rectangular portion and a second rectangular portion protruding from said first rectangular portion in said pitch direction and smaller than said first rectangular portion, ones of said N gate electrodes other than said last gate electrode extend over said first rectangular portion and said last gate electrode extends over said second rectangular portion.

3. The semiconductor integrated circuit device according to claim 1, wherein a length of said second rectangular portion in said height direction is less than a half of a length of said first rectangular portion in said height direction.

4. The semiconductor integrated circuit device according to claim 3, wherein said second rectangular portion is provided on a side near said gate base electrode.

5. The semiconductor integrated circuit device according to claim 3, wherein said last gate electrode is shorter than said N gate electrodes other than said last gate electrode in length.

6. The semiconductor integrated circuit device according to claim 3, wherein said last gate electrode is equal to said N gate electrodes other than said last gate electrode in length.

7. The semiconductor integrated circuit device according to claim 2, wherein said second rectangular portion is provided on a side apart from said gate base electrode.

8. The semiconductor integrated circuit device according to claim 7, wherein said last gate electrode is equal to said N gate electrodes other than said last gate electrode in length.

9. The semiconductor integrated circuit device according to claim 1, wherein a distance between said last gate electrode and said gate electrodes adjacent to said last gate electrode in said pitch direction is wider than a distance between adjacent two of said N gate electrodes other than said last gate electrode in said pitch direction.

10. The semiconductor integrated circuit device according to claim 1, wherein N is equal to or more than 3, a group of source nodes and a group of drain nodes are alternately arranged, and said first and second source nodes are connected with a same power supply line.

11. A semiconductor integrated circuit device with a circuit comprising adjacent first and second transistors, wherein said first transistor comprises:

a first transistor diffusion layer;

a first transistor gate base electrode provided outside said first transistor diffusion layer in a height direction to extend in a pitch direction orthogonal to said height direction;

first transistor N (N is an odd positive integer) gate electrodes provided above said first transistor diffusion layer to extend from said first transistor gate base electrode in a direction opposing to said height direction to pass through said first transistor diffusion layer;

first transistor drain nodes provided on said first transistor diffusion layer along one of said first transistor N gate electrodes as a first transistor head gate electrode outside said first transistor N second gate electrodes; and first transistor source nodes provided on said first transistor diffusion layer along one of said first transistor N gate electrodes as a last gate electrode outside said first transistor N gate electrodes, said first transistor drain nodes are less than said first transistor source nodes, wherein said second transistor comprises:

a second transistor diffusion layer;

a second transistor gate base electrode provided outside said second transistor diffusion layer in said height direction to extend in said pitch direction;

second transistor N gate electrodes provided above said second transistor diffusion layer to extend from said second transistor gate base electrode in the direction opposing to said height direction to pass through said second transistor diffusion layer;

second transistor source nodes provided on said second transistor diffusion layer along one of said second transistor N gate electrodes as a second transistor head gate electrode outside said second transistor N gate electrodes; and second transistor drain nodes provided on said second transistor diffusion layer along one of said second transistor N gate electrodes as a second transistor last gate electrode outside said second transistor N gate electrodes, wherein said second transistor second drain nodes are less than said second transistor source nodes, said first transistor source nodes are common to said second transistor source nodes, and said first transistor diffusion layer is common to said second transistor diffusion layer.

12. The semiconductor integrated circuit device according to claim 11, wherein said first transistor drain nodes are provided on a side apart from said first transistor gate base electrode, and said second transistor drain nodes are provided on a side near said second transistor gate base electrode.

13. The semiconductor integrated circuit device according to claim 11, wherein said first-transistor drain nodes are provided on a side near said first transistor gate base electrode, and said second transistor drain nodes are provided on a side near said second transistor gate base electrode.

14. The semiconductor integrated circuit device according to claim 11, wherein said first transistor drain nodes are provided on a side apart from said first transistor gate base electrode, and said second transistor drain nodes are provided on a side apart from said second transistor gate base electrode.

15. The semiconductor integrated circuit device according to claim 11, wherein N is equal to or more than 3, a group of source nodes and a group of drain nodes are alternately arranged, and said first and second source nodes are connected with a same power supply line.

16. The semiconductor integrated circuit device according to claim 11, wherein said circuit is one of a sense amplifier, a sub-word driver, a main word driver and a Y decoder contained in an array circuit, which is provided around a memory cell array and is constrained in a pitch based on a size of said memory cell array.

17. A semiconductor integrated circuit device comprising adjacent first and second transistors, wherein said first transistor comprises:

a first transistor diffusion layer;

a first transistor gate base electrode provided outside said first transistor diffusion layer in a height direction to extend in a pitch direction orthogonal to said height direction;

first transistor N (N is an odd positive integer) gate electrodes provided above said first transistor diffusion layer to extend from said first transistor gate base electrode in a direction opposing to said height direction to pass through said first transistor diffusion layer;

first transistor drain nodes provided on said first transistor diffusion layer along one of said first transistor N gate electrodes as a first transistor head gate electrode outside said first transistor N gate electrodes; and first transistor source nodes provided on said first transistor diffusion layer along one of said first transistor N gate electrodes as a first transistor last gate electrode outside said first transistor N gate electrodes, said first transistor drain nodes are less than said first transistor source nodes, wherein said second transistor comprises:

a second transistor diffusion layer;

a second transistor gate base electrode provided outside said second transistor diffusion layer in a direction opposing to said height direction to extend in said pitch direction;

second transistor N gate electrodes provided above said second transistor diffusion layer to extend from said second transistor gate base electrode in said height direction to pass through said second transistor diffusion layer;

second transistor source nodes provided on said second transistor diffusion layer along one of said second transistor N gate electrodes as a second transistor head gate electrode outside said second transistor N gate electrodes; and second transistor drain nodes provided on said second transistor diffusion layer along one of said second transistor N gate electrodes as a second transistor last gate electrode outside said second transistor N gate electrodes, wherein said second transistor drain nodes are less than said second transistor source nodes, said first transistor source nodes are common to said second transistor source nodes, and said first transistor diffusion layer is common to said second transistor diffusion layer.

18. The semiconductor integrated circuit device according to claim 17, wherein said first transistor drain nodes are provided on a side apart from said first transistor gate base electrode, and said second transistor drain nodes are provided on a side near said second transistor gate base electrode.

19. The semiconductor integrated circuit device according to claim 17, wherein said first transistor drain nodes are provided on a side near said first transistor gate base electrode, and said second transistor drain nodes are provided on a side near said second transistor gate base electrode.

20. The semiconductor integrated circuit device according to claim 17, wherein said first transistor drain nodes are provided on a side apart from said first transistor gate base electrode, and said second transistor drain nodes are provided on a side apart from said second transistor gate base electrode.

21. The semiconductor integrated circuit device according to claim 17, wherein N is equal to or more than 3, a group of source nodes and a group of drain nodes are alternately arranged and said first and second source nodes are connected with a same power supply line.

22. The semiconductor integrated circuit device according to claim 17, wherein said circuit is one of a sense amplifier, a sub-word driver, a main word driver and a Y decoder contained in an array circuit, which is provided around a memory cell array and is constrained in a pitch based on a size of said memory cell array.

* * * * *